US011527685B2

(12) United States Patent
Chang et al.

(10) Patent No.: US 11,527,685 B2
(45) Date of Patent: Dec. 13, 2022

(54) EMITTING DEVICES, ASSOCIATED DISPLAY SCREEN AND METHODS FOR FABRICATING AN EMITTING DEVICE

(71) Applicant: Aledia, Echirolles (FR)

(72) Inventors: Ying-Lan Chang, Cupertino, CA (US); Sylvia Scaringella, Montbonnot Saint Martin (FR); Ivan-Christophe Robin, Grenoble (FR); Abdelhay Aboulaich, Grenoble (FR)

(73) Assignee: Aledia, Echirolles (FR)

( * ) Notice: Subject to any disclaimer, the term of this patent is extended or adjusted under 35 U.S.C. 154(b) by 87 days.

(21) Appl. No.: 17/255,480

(22) PCT Filed: Jun. 27, 2019

(86) PCT No.: PCT/EP2019/067237
§ 371 (c)(1),
(2) Date: Dec. 23, 2020

(87) PCT Pub. No.: WO2020/002544
PCT Pub. Date: Jan. 2, 2020

(65) Prior Publication Data
US 2021/0257523 A1  Aug. 19, 2021

(30) Foreign Application Priority Data

Jun. 28, 2018  (FR) ...................................... 1855855

(51) Int. Cl.
*H01L 33/50* (2010.01)
*H01L 33/00* (2010.01)
(52) U.S. Cl.
CPC .......... *H01L 33/505* (2013.01); *H01L 33/005* (2013.01); *H01L 33/504* (2013.01); *H01L 2933/0041* (2013.01)

(58) Field of Classification Search
None
See application file for complete search history.

(56) References Cited

U.S. PATENT DOCUMENTS

2012/0032142 A1  2/2012  Leatherdale et al.
2016/0293805 A1*  10/2016  Choi ..................... H01L 33/505
(Continued)

FOREIGN PATENT DOCUMENTS

FR  3 031 238 A1  7/2016

OTHER PUBLICATIONS

Rapport De Recherche Internationale issued in corresponding International Patent Application No. PCT/EP2019/067237 dated Nov. 12, 2019.
(Continued)

*Primary Examiner* — Bo B Jang
(74) *Attorney, Agent, or Firm* — Troutman Pepper Hamilton Sanders LLP

(57) ABSTRACT

An emitting device comprising a first light emitter adapted to emit a first radiation, and a second light emitter adapted to emit a second radiation different from the first radiation, the first light emitter comprising a first semiconducting structure and a first radiation converter, the second light emitter comprising a second semiconducting structure and a second radiation converter, each semiconducting structure comprising a semiconducting layer adapted to emit a third radiation, each radiation converter comprising a set of particles able to convert the third radiation into the first or second radiation, the particles of the first radiation converter being attached to a surface by a bulk of photosensitive resin and the particles of the second radiation converter being attached to a surface by grafting.

14 Claims, 7 Drawing Sheets

(56) References Cited

U.S. PATENT DOCUMENTS

2016/0308089 A1\* 10/2016 Kim ........................ H01L 33/54
2017/0250316 A1     8/2017 Keon et al.
2017/0373118 A1\* 12/2017 Hugon .................... H01L 33/62

OTHER PUBLICATIONS

Rapport De Recherche Preliminaire Partiel issued in corresponding French Patent Application No. 1855855 dated Mar. 27, 2019.

\* cited by examiner

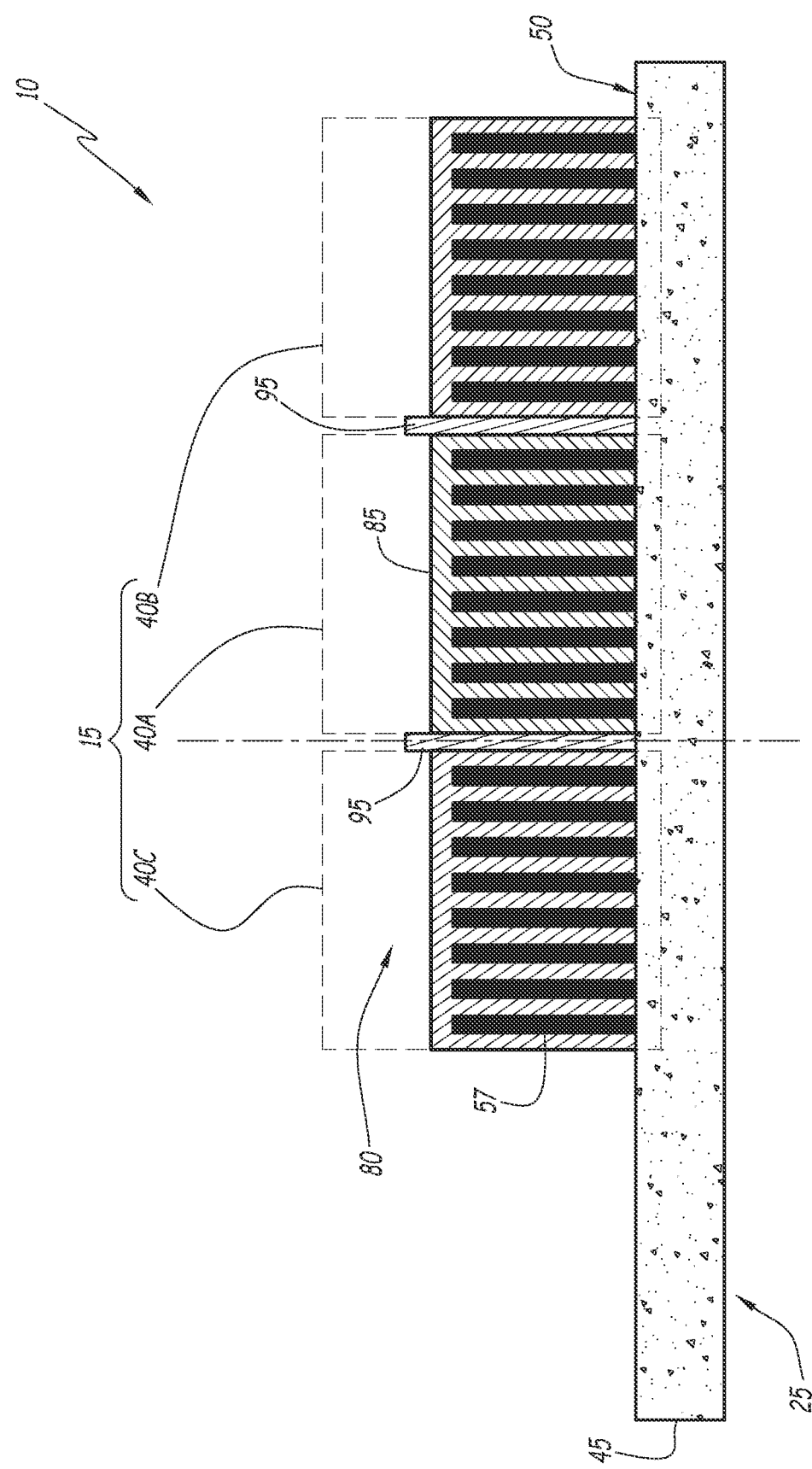

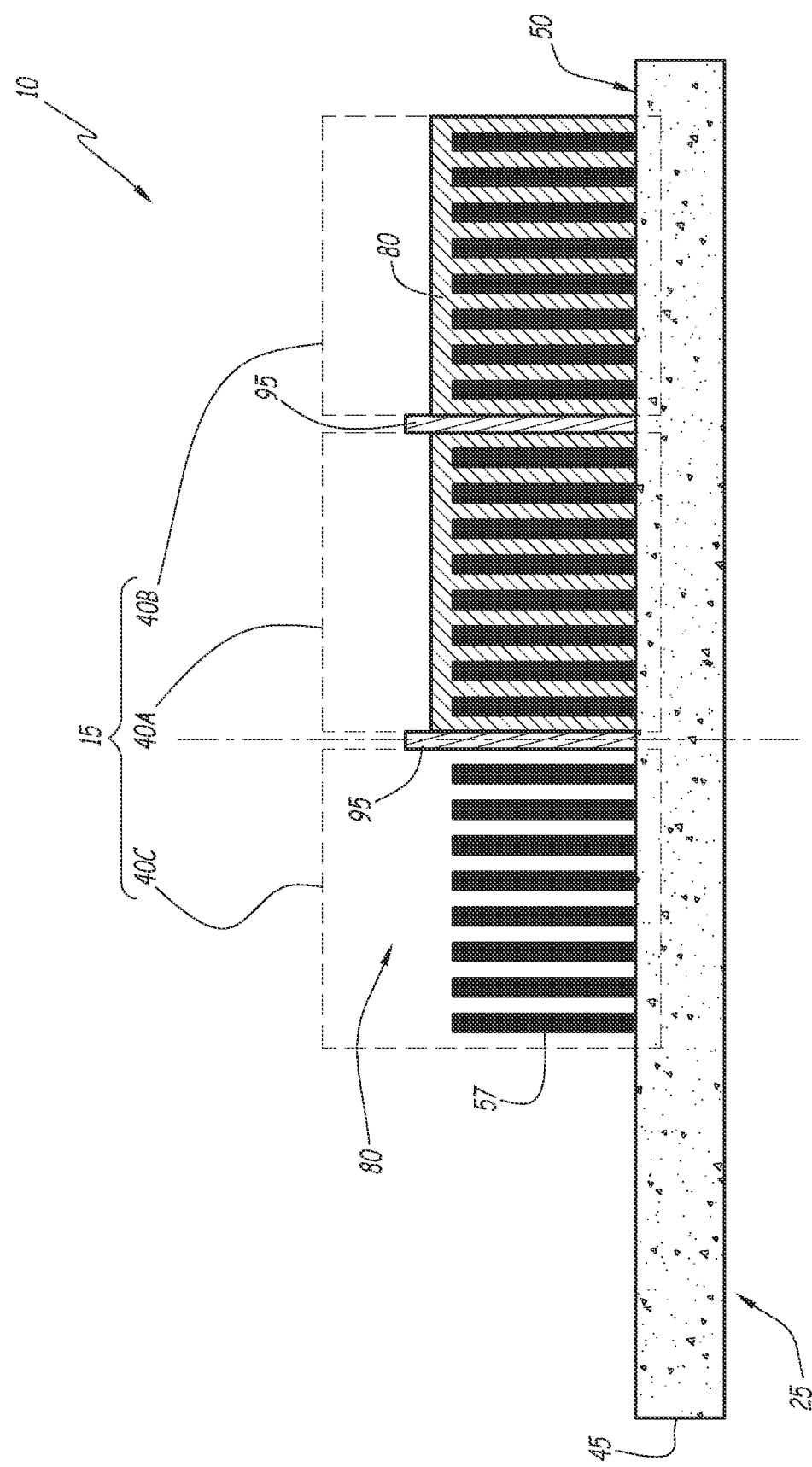

EMITTING DEVICES, ASSOCIATED DISPLAY SCREEN AND METHODS FOR FABRICATING AN EMITTING DEVICE

CROSS REFERENCE TO RELATED APPLICATIONS

This is a U.S. National Phase Application under 35 U.S.C. § 371 of International Patent Application No. PCT/EP2019/067237, filed Jun. 27, 2019, which claims priority of French Patent Application No. 18 55855, filed Jun. 28, 2018. The entire contents of which are hereby incorporated by reference.

FIELD OF THE INVENTION

The present invention concerns an emitting device. The present invention also concerns a display screen comprising a set of such emitting devices and a method for fabricating such an emitting device.

BACKGROUND OF THE INVENTION

Display screens often comprise a set of "picture elements", also called "pixels", that are each able to emit light, so that the image on the screen may be controlled by turning on or off the individual pixels. In color screens, each pixel comprises several sub-pixels, each sub-pixel being configured to emit a specific color, so that the color emitted by the pixel may be tuned by controlling which sub-pixel(s) is or are turned on or by tuning the electrical current applied to each sub-pixel in order to change the relative emission intensity of each sub-pixel.

Semiconducting structures such as Light-Emitting Diodes (LED) are commonly used for varying purposes such as lighting due to their potential good light-emission efficiency. Because of this potential high efficiency, LEDs have been suggested for making high-efficiency display screens.

LED structures usually take the shape of a stack of planar semiconducting layers. Light is emitted when an electrical current flows through the stack. However, although some technologies and materials for making LED structures allow for a good emission efficiency over one part specific of the visible spectrum, for example in the blue range, the same technologies usually lead to much lower efficiencies when used for making an LED structure emitting over a different part of the spectrum. Fabricating pixels wherein each sub-pixel has a LED structure emitting in a different part of the visible spectrum than the other sub-pixels is thus difficult and may notably require using different types of materials for each sub-pixel.

According to one way of obtaining the sub-pixels, radiation converters are placed onto the surface of the LED structure in order to convert the light emitted by the portion of the structure underneath the converter into a light having a different wavelength from the light originally emitted by the layer. Thus, working sub-pixels may be obtained by placing over specific areas of the LED structure different radiation converters so that by selectively supplying the area underneath each different converter with electrical current, the light emitted by the semiconducting layer or layers is converted into a light having a specific color.

However, during the placement step, the position of the radiation converters is difficult to control. For example, if the radiation converters are particles contained in photosensitive resins and deposited using photolithography, part of the insolation light is scattered by the particles and may end up insolating some undesired part of the resin. Even using other techniques, when two radiation converters are to be placed next to each other, some intermixing may occur and result in the color of the sub-pixel being different from the expected color. Such effects are all the stronger as the spatial pitch between the pixels decreases.

SUMMARY OF THE INVENTION

In consequence, there is a need for an emitting device, notably a pixel, that has small-dimensioned sub-pixels, while permitting a good control of the wavelength of the light emitted by each sub-pixel.

For this, the present description concerns an emitting device comprising:
a first light emitter, the first light emitter being adapted to emit a first radiation, and
a second light emitter, the second light emitter being adapted to emit a second radiation, the second radiation being different from the first radiation,
the first light emitter comprising a first semiconducting structure and a first radiation converter, the second light emitter comprising a second semiconducting structure and a second radiation converter, each semiconducting structure comprising a semiconducting layer adapted to emit a third radiation different from the first radiation and the second radiation, each radiation converter comprising a set of particles, each particle being able to convert the third radiation into the first or second radiation emitted by the corresponding light emitter, the particles of the first radiation converter being attached by a bulk of photosensitive resin to a surface of the first light emitter, such as a surface of the first semiconducting structure, and the particles of the second radiation converter being attached by grafting to a surface of the second light emitter, such as a surface of the second semiconducting structure.

According to specific embodiments, the emitting device comprises one or several of the following features, taken separately or according to any possible combination:
the second radiation converter comprises a stack of at least one layer of particles and at least one grafting layer of organic molecules, the layer of particles being attached to a surface of the second light emitter by the grafting layer.
a mean wavelength of the second radiation is strictly inferior to a mean wavelength of the first radiation.
the emitting device comprises at least one third emitter, the third light emitter being adapted to emit a fourth radiation, the fourth radiation being different from the first radiation and the second radiation, the third light emitter comprising at least one third semiconducting structure, the third semiconducting structure comprising a third semiconducting layer, the third semiconducting layer being adapted to emit the fourth radiation.
the emitting device comprises at least one fourth light emitter, the fourth light emitter being adapted to emit a fifth radiation, the fifth radiation being different from the first radiation and the second radiation, the fourth light emitter comprising a fourth semiconducting structure and a fourth radiation converter, the fourth semiconducting structure comprising a semiconducting layer adapted to emit a third radiation different from the fifth radiation, the radiation converter of the fourth light emitter comprising a set of particles, each particle being able to convert the third radiation into the fifth radiation.

the emitting device comprises at least one at least one wall able to prevent a radiation emitted by one light emitter from reaching another light emitter.

The present description also concerns a method for fabricating an emitting device comprising
- a first light emitter, the first light emitter being adapted to emit a first radiation, and
- a second light emitter, the second light emitter being adapted to emit a second radiation, the second radiation being different from the first radiation, the method comprising steps for:
- fabricating at least one first semiconducting structure and at least one second semiconducting structure, the first semiconducting structure comprising a first semiconducting layer, the second semiconducting structure comprising a second semiconducting layer, each first and second semiconducting layer being adapted to emit a third radiation different from the first radiation and the second radiation,
- positioning, onto a surface of the first light emitter, a bulk of photosensitive resin comprising particles able to convert the third radiation of the first semiconducting layer into the first radiation,
- depositing, onto to a surface of the second light emitter, a grafting layer, and
- depositing, onto the grafting layer, a layer of particles able to convert the third radiation of the second semiconducting layer into the second radiation, each particle being attached to the surface of the second light emitter by the grafting layer.

The present description also concerns an emitting device comprising:
- a first light emitter, the first light emitter being adapted to emit a first radiation, the first light emitter comprising at least one first semiconducting structure, the first semiconducting structure comprising a first semiconducting layer, the first semiconducting layer being adapted to emit a second radiation, and
- at least one second light emitter, each second light emitter being adapted to emit a third radiation, the third radiation being different from the first radiation, the second light emitter comprising at least one second semiconducting structure, the second semiconducting structure comprising a second semiconducting layer adapted to emit a fourth radiation,
- each light emitter further comprising a radiation converter, each radiation converter comprising a mixture of first particles and second particles, each first particle being able to convert the second radiation into the first radiation, each second particle being able to convert the fourth radiation into the third radiation.

According to specific embodiments, the emitting device comprises one or several of the following features, taken separately or according to any possible combination:
- each first particle is transparent to the second radiation and each second particle is transparent to the fourth radiation.
- at least one of the following properties is verified:
  - the mixture of first particles and second particles is embedded in a photosensitive resin,
  - the mixture of first particles and second particles is attached to a surface of the first and second light emitters by grafting, and
  - one radiation among the second radiation and the fourth radiation is an ultraviolet radiation, the other radiation among the second radiation and the fourth radiation being a blue radiation.

The present description also concerns a method for fabricating an emitting device comprising a first light emitter and at least one second light emitter, the first light emitter being adapted to emit a first radiation, each second light emitter being adapted to emit a third radiation, the third radiation being different from the first radiation, the method comprising steps for:
- providing at least one first semiconducting structure and at least one second semiconducting structure, the first semiconducting structure comprising a first semiconducting layer, the first semiconducting layer being adapted to emit a second radiation, the second semiconducting structure comprising a second semiconducting layer adapted to emit a fourth radiation, and
- depositing a mixture of first particles and second particles, each first particle being able to convert the second radiation into the first radiation, each second particle being able to convert the fourth radiation into the third radiation.

According to a specific embodiment, at least one of the following properties is verified:
- the step for depositing comprises depositing a bulk of resin comprising the mixture onto each of the first and second semiconducting structure, and
- the step for depositing comprises depositing a grafting layer onto a surface of the first and second light emitters and depositing the mixture onto the grafting layer, each particle of the mixture being attached to the respective surface of each of first and second light emitters by the grafting layer.

A display screen comprising a set of emitting devices as previously defined is also proposed.

BRIEF DESCRIPTION OF THE DRAWINGS

Features and advantages of the invention will be made clear by the following specification, given only as a non-limiting example, and making a reference to the annexed drawings, on which:

FIG. 6 is a partial side view of a third example of display screen comprising a set of emitting devices comprising three-dimensional structures, and FIG. 7 is a partial side view of a fourth example of display screen comprising a set of emitting devices comprising three-dimensional structures.

DETAILED DESCRIPTION OF PREFERRED EMBODIMENTS

Figure 1:
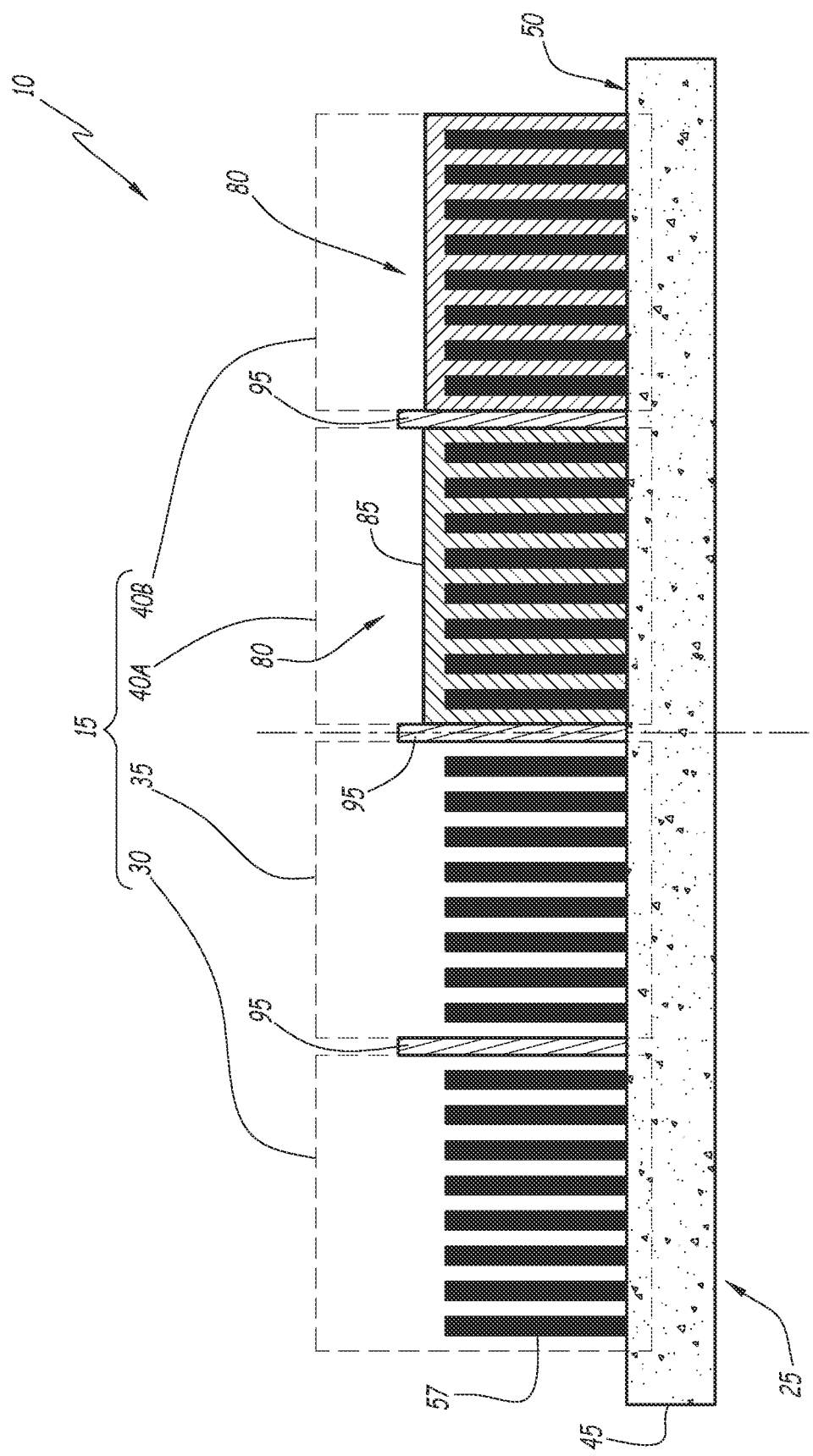
FIG. 1 is a partial side view of a first example of display screen comprising a set of emitting devices comprising three-dimensional structures.

Several examples of display screens 10 are described below.

Each display screen 10 is, for example, integrated in an electronic device such as a mobile phone, a tablet or a laptop computer. In another embodiment, the display screen 10 is integrated in dedicated display device such as a television set or a desktop computer screen.

Each display screen 10 is configured for displaying a set of images.

Each display screen 10 comprises a set of emitting devices 15 and a control circuit.

Each emitting device 15, also called "picture element", or in short "pixel" is configured for emitting at least one radiation.

For example, each pixel 15 is configured to emit one of a set of radiations comprising a first radiation, a second radiation and at least one third radiation. In an embodiment, each pixel 15 is configured to emit one of a set of radiations comprising a first radiation, a second radiation and two third radiations. In particular, each pixel 15 is configured to emit each radiation of a set of radiations comprising a first radiation, a second radiation and two third radiations.

It should be noted that each emitting device 15 may be used as a single light source outside of a display screen.

As is shown on FIG. 1, each emitting device 15 comprises a substrate 25 and a set of light emitters 30, 35, 40A, 40B.

In particular, in all embodiments described below, the emitting device 15 may comprise at least one first light emitter 30 and/or at least one second light emitter 35 and/or at least one third light emitter 40A, 40B.

As will appear below, the expressions "first light emitter" 30, "second light emitter" 35 and "third light emitter" 40A, 40B each relate to different types of light emitters 30, 35, 40A, 40B.

Each type of light emitter 30, 35, 40A, 40B may differ from the other types of light emitter 30, 35, 40A, 40B by the wavelength of the associated radiation or radiations, or by its structure. Notably, the "first light emitter" 30 and "second light emitter" 35 are each deprived of radiation converter, while each "third light emitter" 40A, 40B comprises a radiation converter 80. Light emitters 30, 35 that are deprived of radiation converter 80 are sometimes called "native color" emitters or "native color" subpixels, whereas light emitters 40A, 40B that comprise a radiation converter 80 are called "converted emitters".

Each radiation comprises a set of electromagnetic waves.

Each set corresponds to a range of wavelengths. The range of wavelengths is the group formed by all the wavelengths of the set of electromagnetic waves.

The first radiation comprises a first set of electromagnetic waves.

The first set of electromagnetic waves corresponds to a first range of wavelengths.

A first mean wavelength is defined for the first range of wavelengths.

A mean wavelength equal to half of the sum of the largest and the smallest wavelengths of the first range of wavelengths is an example of first mean wavelength.

The first radiation is, for example, a blue radiation. A first radiation whose first mean wavelength is comprised between 430 nanometers (nm) and 490 nm is an example of blue radiation.

The second radiation is different from the first radiation.

The second radiation comprises a second set of electromagnetic waves.

The second set of electromagnetic waves corresponds to a second range of wavelengths.

A second mean wavelength is defined for the second range of wavelengths. A mean wavelength equal to half of the sum of the largest and the smallest wavelengths of the second range of wavelengths is an example of second mean wavelength.

The second mean wavelength is, in an embodiment, different from the first mean wavelength.

The second radiation is, for example, a green radiation. A second radiation whose second mean wavelength is comprised between 500 nm and 560 nm is an example of green radiation.

Each third radiation is, for example, different from the first radiation and the second radiation.

Each third radiation comprises a third set of electromagnetic waves.

Each third set of electromagnetic waves corresponds to a third range of wavelengths.

A third mean wavelength is defined for each third range of wavelengths. A mean wavelength equal to half of the sum of the largest and the smallest wavelengths of the third range of wavelengths is an example of third mean wavelength.

The third mean wavelength is, for example, strictly superior to at least one of the first mean wavelength and the second mean wavelength.

In an embodiment, the third mean wavelength is strictly superior to both the first mean wavelength and the second mean wavelength.

One of the third radiations is, for example, a red radiation. For example, the corresponding third mean wavelength is, for example, comprised between 580 nm and 700 nm.

When the emitting device 15 is able to emit two third radiations, the other third radiation is, for example, a white radiation or a yellow radiation.

An example of white third radiation is a third radiation comprising either:
 at least one blue radiation, at least one green radiation, and at least one red radiation, or
 at least one blue radiation and at least one yellow radiation.

A radiation whose mean wavelength is comprised between 560 nm and 580 nm is an example of yellow radiation.

The substrate 25 is configured to support each light emitter 30, 35, 40A and 40B.

The substrate 25 is, for example, common to all light emitters 30, 35, 40A and 40B.

The substrate 25 is, for example, planar. A planar substrate is a substrate 25 having a planar support face 50.

A normal direction D is defined for the substrate 25. The support face 50 of the substrate 25 is perpendicular to the normal direction D.

The substrate 25 is made of a substrate semiconductor material. A substrate bandgap value is defined for the substrate semiconductor material.

According to an embodiment, the substrate material is silicon. In other possible embodiments, the substrate semiconductor material is another semiconductor material such as silicon carbide.

In an embodiment, the substrate semiconductor material is, for example, a III-nitride material. III-nitride materials are a group of materials comprising GaN, AlN and InN and the alloys of GaN, AlN and InN. For example, the substrate semiconductor material is GaN.

The substrate material is, for example, n-doped. However, the type of doping may vary in some embodiments.

In an embodiment, at least part of the support face 50 is covered with an electrically insulating material such as $SiO_2$ or SiN. The electrically insulating material is, for example, patterned to define holes extending through the electrically insulating material layer and allowing for a selective deposition of material in the holes.

Each light emitter 30, 35, 40A and 40B comprises at least one semiconducting structure. The expression "semiconducting structure" shall be understood as encompassing any structure made at least partially of a semiconducting material.

A stack of semiconducting layers stacked along the normal direction D is an example of semiconducting structure. Such a structure is often called "two-dimensional structure".

A three-dimensional semiconducting structure or a set of three-dimensional semiconducting structures are other examples of semiconducting structures.

A lateral dimension is defined for each light emitter 30, 35, 40A and 40B. The lateral dimension is the maximum dimension of a contour surrounding the light emitter 30, 35, 40A, 40B in a plane perpendicular to the normal direction D while not surrounding any portion of any other light emitter 30, 35, 40A, 40B.

The lateral dimension is inferior or equal to 20 µm. For example, the lateral dimension is inferior or equal to 10 µm. In an embodiment, the lateral dimension is inferior or equal to 5 µm.

Each light emitter 30, 35, 40A and 40B is configured to emit a radiation. For example, each semiconducting structure of each light emitter 30, 35, 40A and 40B is a LED structure.

Figure 2:
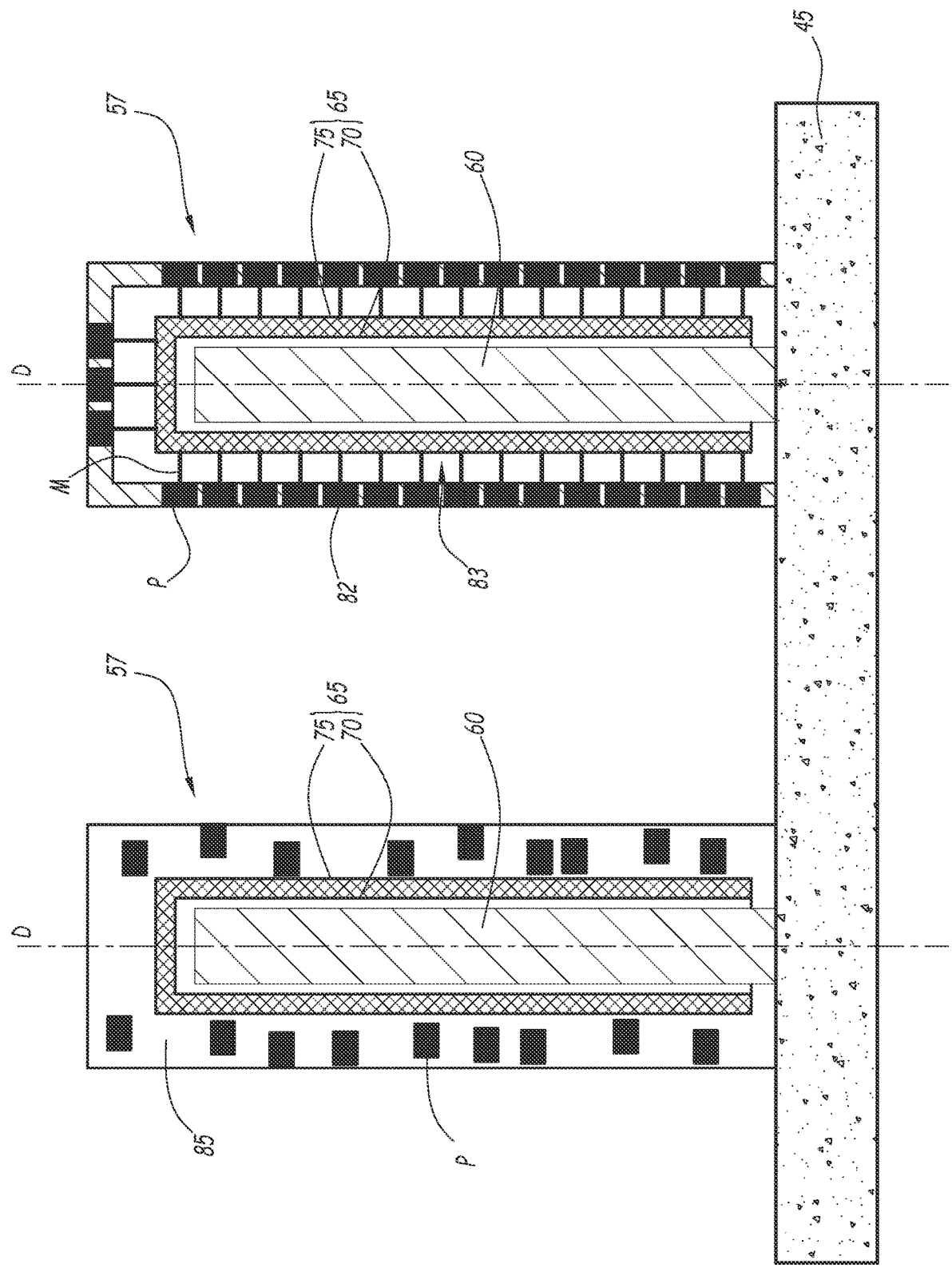
FIG. 2 is a side cut-away view of two examples of three-dimensional structures of FIG. 1.

FIG. 2 illustrates two examples of three-dimensional semiconducting structures 57, each forming a LED structure which may be used in any one of the first, second or third light emitters 30, 35, 40A and 40B.

Each three-dimensional semiconducting structure 57 extends from the substrate 25 along the normal direction D.

The three-dimensional structure 57 is, for example, a microwire.

Each three-dimensional semiconducting structure 57 comprises a core 60 and a covering layer 65.

The core 60 plays the role of either a n-doped layer or a p-doped layer. The core 60 is made of a semiconducting material named "core semiconducting material" in what follows.

For example, the core semiconducting material is n-doped.

The core semiconducting material is, for example, GaN.

The core 60 is configured to support the covering layer 65.

The core 60 extends from the substrate 25 along the normal direction D. In particular, the core 60 is electrically connected to the substrate 25.

The core 60 extends, for example, through the electrically insulating layer covering part of the support face 50, when such a layer is present.

The core 60 is, for example, a cylinder.

A cylindrical surface is a surface consisting of all the points on all the lines which are parallel to a line and which pass through a fixed plane curve in a plane not parallel to the line. A solid bounded by a cylindrical surface and two parallel planes is called a cylinder. When a cylinder is said to extend along a given direction, this direction is parallel to the line.

A cylinder has a uniform cross-section along the direction along which the cylinder extends.

The cross-section of the core 60 is polygonal. For example, the cross-section is hexagonal.

However, other shapes may be considered for the cross-section.

It should be noted that the shape of the core 60 may vary, for example if the three-dimensional structure 57 is not a microwire.

A diameter is defined for the core 60. The diameter is, in the case of a cylindrical core 60, the maximal distance between two points of the core 60 that are diametrically opposed in a plane perpendicular to the normal direction D.

When the core 60 has a hexagonal cross-section, the diameter of the core is measured between two opposite angles of the hexagon.

The diameter of the core 60 is comprised between 10 nm and 5 µm.

A length measured along the normal direction D is defined for the core 60. The length is comprised between 10 nm and 100 µm.

The core 60 has a top side and a lateral side.

The top side delimits the core 60 along the normal direction D. For example, the top side is perpendicular to the normal direction D.

The lateral side surrounds the core 60 in a plane perpendicular to the normal direction D.

The lateral side extends between the top side and the substrate 25. When the core 60 has a polygonal cross-section, the lateral side has a set of plane facets.

The covering layer 65 covers at least partially the core 60. For example, the covering layer 65 covers at least partially the top side of the core. In particular, the covering layer 65 covers completely the top side.

In the example shown on FIG. 2, the covering layer 65 covers at least partially the top side and at least partially the lateral side.

As visible on FIG. 2, the covering layer 65 surrounds completely the core 60 in a plane perpendicular to the normal direction D. In other words, the covering layer 65 forms a shell around the core 60.

The covering layer 65 comprises at least one emitting layer 70 and a doped layer 75.

Each emitting layer 70 is interposed between the core 60 and the doped layer 75.

For example, the covering layer 65 comprises a stack of emitting layers 70 interposed between the core 60 and the doped layer 75.

Each emitting layer 70 is, for example, a quantum well. In particular, the thickness of each emitting layer 70 is, in any point of the emitting layer 70, comprised between 1 nm and 200 nm.

The thickness of each emitting layer 70 is measured, in any point of the emitting layer 70, along a direction perpendicular to the surface of the core 60 at the point of the surface of the core 60 that is the closest to the point of the emitting layer 70 considered.

For example, the thickness of each emitting layer 70 in a point of the emitting layer 70 that is aligned with a point of the core 60 along the normal direction D is measured along the normal direction D. The thickness of each emitting layer 70 in a point of the emitting layer 70 that is aligned in a plane perpendicular to the normal direction with a point of the core 60 is measured along a direction perpendicular to the nearest facet of the core 60.

Each emitting layer 70 is, for example, made of InGaN.

The doped layer 75 covers at least partially the emitting layer or layers 70.

The doped layer 75 plays the role of a n-doped layer or of a p-doped layer of the LED structure.

The type of doping (n or p) of the doped layer 75 is opposed to the type of doping (p or n) in the core 60. For example, the doped layer 75 is p-doped.

The doped layer 75 is, for example, made of GaN.

When a first, a second or a third light emitter 30, 35, 40A and 40B comprises at least one three-dimensional semiconducting structure 57, a filling factor of three-dimensional semiconducting structures 57 is defined for the light emitter 30, 35, 40A and 40B considered.

The filling factor is the ratio between the sum of the surfaces of the cross-sections of all three-dimensional semiconducting structures 57 attached to a specific area of the substrate 25 to the surface of this area.

For example, if the substrate 25 of one light emitter 30, 35, 40A and 40B measures 400 square micrometers ($\mu m^2$) and this light emitter 30, 35, 40A and 40B comprises four three-dimensional semiconducting structures 57 having each a cross-section surface of 5 $\mu m^2$, a filling factor is equal to 4×5/400=1/20.

When a light emitter 30, 35, 40A and 40B comprises a set of three-dimensional semiconducting structures 57, a mean diameter for the set of three-dimensional semiconducting structures 57 is defined for the light emitter 30, 35, 40A and 40B.

The mean diameter is, for example, the mean diameter of the cores 60 of the three-dimensional semiconducting structures 57. The mean is, for example, an arithmetic mean.

In an embodiment, the diameters of all the cores 60 of a same light emitter 30, 35, 40A and 40B are identical. In other embodiments, the diameters of the cores 60 of a same light emitter 30, 35, 40A and 40B may differ, for example by up to 10%.

If the light emitter 30, 35, 40A and 40B comprises only one three-dimensional semiconducting structure 57, the mean diameter is the diameter of this three-dimensional structure.

Each first light emitter 30 is configured to emit the first radiation.

Each first light emitter 30 comprises a semiconducting structure called first semiconducting structure.

Each emitting layer 70 of each first semiconducting structure is called "first semiconducting layer".

Each first semiconducting layer is made of a semiconducting first emitting material having a first emitting bandgap.

The first emitting material is, for example, InGaN.

Each first semiconducting layer is adapted to emit the first radiation. For example, the composition and/or the thickness of each first semiconducting layer are chosen so that the first mean wavelength has the expected value.

Each second light emitter 35 is configured to emit the second radiation.

Each second light emitter 35 comprises a semiconducting structure called second semiconducting structure.

Each emitting layer 70 of each second semiconducting structure is called "second semiconducting layer".

Each second semiconducting layer is made of a semiconducting second emitting material having a second emitting bandgap.

The second emitting material is, for example, different from the first emitting material. In this case, the second emitting bandgap is different from the first emitting bandgap.

In a variant, the second emitting material is identical to the first emitting material but the thickness of the second semiconducting layer is different from the thickness of the first semiconducting layer so as to obtain the emission of a second radiation different from the first radiation despite the identical bandgaps. In particular, the second semiconducting layer is a quantum well so that the mean wavelength of the second radiation depends on the thickness of each second semiconducting layer.

In a specific embodiment, both the thickness and the composition of the first and second semiconducting layers are different.

The second emitting material is, for example, InGaN.

Each second semiconducting layer is adapted to emit the second radiation. For example, the composition and/or the thickness of each second semiconducting layer are chosen so that the second mean wavelength has the expected value.

In the case where both the first semiconducting structure and the second semiconducting structure each comprise a respective set of three-dimensional semiconducting structures 57, at least one among the filling factor and the mean diameter of the cores 60 may vary between the first light emitter 30 and the second light emitter 35. This is particularly the case where the first emitting material and the second emitting material comprise the same set of chemical elements, for example if the first emitting material and the second emitting material are both InGaN.

For example, the filling factor of three-dimensional semiconducting structures 57 is strictly lower for the first light emitter 30 than the second light emitter 35.

For example, the mean diameter is strictly smaller for the first light emitter 30 than the second light emitter 35.

Each third light emitter 40A, 40B is configured to emit a fourth radiation.

Each fourth radiation is different from the third radiation emitted by the same light emitter 40A, 40B. In particular, the fourth radiation has a fourth mean wavelength, the fourth mean wavelength being strictly shorter than the third mean wavelength. For example, a difference between the fourth mean radiation and the third mean radiation is superior or equal to 40 nm.

The fourth radiation is, for example, identical to one among the first radiation and the second radiation.

In another embodiment, the fourth radiation is an ultraviolet light. An ultraviolet light is an electromagnetic wave having a wavelength comprised between 10 nm and 400 nm, for example comprised between 200 nm and 400 nm.

Each third light emitter 40A, 40B comprises a semiconducting structure called third semiconducting structure and a radiation converter 80.

Each emitting layer 70 of each third semiconducting structure is called "third semiconducting layer".

Each third semiconducting layer is made of a semiconducting third emitting material having a third emitting bandgap.

Each third semiconducting layer is adapted to emit the corresponding fourth radiation. For example, the composition and/or the thickness of each third semiconducting layer is chosen so that the fourth mean wavelength has the expected value.

In the case when the fourth radiation is identical to the first or second radiation, each third semiconducting layer is identical to the corresponding first or second semiconducting layer, respectively. For example, the filling factor and mean diameter of the third semiconducting structure is respectively identical to the filling factor and mean diameter of one among the first and second semiconducting structures.

In a variant, the filling factor and mean diameter of the third semiconducting structure are respectively different from the filling factor and mean diameter of both the first and second semiconducting structures.

Each radiation converter 80 is configured to convert the fourth radiation of the third light emitter 40A, 40B comprising the radiation converter into the corresponding third radiation.

In contrast, the first light emitter 30 and the second light emitter 35 are each deprived of radiation converter 80.

Many types of radiation converters are used in lighting, for example in fluorescent tubes. Such radiation converters are often called "phosphors".

The radiation converter 80 is made of a converting material.

The converting material is configured to convert the fourth radiation into the third radiation. In other words, the converting material is configured to be excited by the fourth radiation and to emit in response the third radiation.

The converting material is, for example, a semiconductor material.

According to other embodiments, the converting material is a non-semiconductor material such as a doped Yttrium-Aluminum garnet.

In particular, the converting material may be an inorganic phosphor.

Examples of inorganic phosphors are yttrium aluminum garnet (YAG)-based particles (e.g. YAG:Ce), terbium aluminum garnet (TAG)-based particles (e.g. TAG:Ce), silicate-based particles (e.g. $SrBaSiO_4$:Eu), sulfide-based particles (e.g. $SrGa_2S_4$:Eu, SrS:Eu, CaS:Eu, etc.), nitride-based particles (e.g. $Sr_2Si_5N_8$:Eu, $Ba_2Si_5N_8$:Eu, etc.), oxynitride-based particles (e.g. Ca-α-SiAlON:Eu, $SrSi_2O_2N_2$:Eu, etc.), fluoride-based particles (e.g. $K_2SiF_6$:Mn, $Na_2SiF_6$:Mn, etc).

Many other converting materials may be used, such as aluminate, nitride, fluoride, sulfide or silicate doped materials.

The converting material is, for example, doped using rare earth, alkaline earth metal or transition metal elements. Cerium is, for example, sometime used for doping Yttrium-Aluminum garnets.

The radiation converter 80 comprises, for example, a set of particles P made of the converting material. Such particles P are sometimes called luminophores.

Each particle P has, for example, a diameter smaller than or equal to 2 μm. In particular, each particle P has a diameter smaller than or equal to 1 μm. In an embodiment, each particle P has a diameter smaller than or equal to 500 nm, for example smaller than or equal to 200 nm.

In other words, if each particle P has a diameter smaller than or equal to 2 μm, the D100 value for the set of particles is inferior or equal to 2 μm.

In an embodiment, each particle P is a quantum dot.

Quantum dots can be selected from II-VI group semiconductor nanocrystals, III-V group, IV-VI group or a mixture thereof.

The II-VI group semiconductor nanocrystals may include, but are not limited to CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe.

The group III-V group semiconductor nanocrystals may include, but are not limited to GaN, GaP, GaAs, AlN, AlP, AlAs, InN, InP, InAs, InGaN, GaNP, GaNAs, GaPAs, AlNP, AlNAs, AlPAs and InAlPAs.

The IV-VI group semiconductor nanocrystals may include, but are not limited to SbTe, PbSe, GaSe, PbS, PbTe, SnS, SnTe, PbSnTe. Chalcopyrite-type semiconductor nanocrystals selected from the group consisting of $CuInS_2$, $CuInSe_2$, $CuGaS_2$, $CuGaSe_2$, $AgInS_2$, $AgInSe_2$, $AgGaS_2$, and $AgGaSe_2$ could also be considered.

Another example of quantum dot is particle P having a core and a shell surrounding the core, the core being made of a semiconducting converter material and having a maximal dimension comprised between 1 nm and 200 nm.

The core may comprise, for example, a nanocrystal such as those described hereabove.

The shell may be made of ZnS, CdS, ZnSe, CdSe or any mixture thereof.

Quantum dots may also be protected from oxidation by using a metal oxide protection layer, a metal nitride protection layer, an oxynitride protection layer or a mixture thereof.

A metal oxide protection layer can be selected, but is not limited to, the group consisting of $Al_2O_3$, $SiO_2$, $TiO_2$, $ZrO_2$, $B_2O_3$, $Co_2O_3$, $Cr_2O_3$, CuO, $Fe_2O_3$, $Ga_2O_3$, $HfO_2$, $In_2O_3$, MgO, $Nb_2O_5$, NiO, $SnO_2$, $Ta_2O_5$.

Metal nitrides may be for example BN, AlN, GaN, InN, $Zr_3N_4$, CuZN, etc.

An oxynitride protection layer could include, but is not limited to SiON.

The protection layer thickness can vary from 1 to 400 nm, preferably from 1 to 100 nm.

It should be noted that the shape of the quantum dot may vary. Examples of quantum dots having different shapes may be called nanorods, nanowires, tetrapodes, nanopyramids, nanocubes, etc.

It should be noted that each particle P may comprise more than one quantum dots, for example by embedding the quantum dots in a porous silica microsphere, or by aggregating several quantum dots.

In an embodiment, the set of particles P comprises a set of quantum dots and a set of neutral particles. Neutral particles are particles that are transparent to the third radiation. For example, the neutral particles are transparent to both the third radiation and the fourth radiation.

Examples of neutral particles include nanoparticles made of $SiO_2$, $TiO_2$ or $Al_2O_3$.

The neutral particles may have a diameter comprised between 50 nm and 1 μm.

The ratio of neutral particles to quantum dots, in weight, may be inferior or equal to 2/1 (neutral particles/quantum dots), for example comprised between 0.1/1 and 1/1.

The particles P of at least one of the third light emitters 40A, 40B may, for example, be embedded in a photosensitive resin. Photosensitive resins, also called "photoresists", are used in many electronic manufacturing techniques to define patterns on a semiconducting surface, in particular, since specific areas of the resin may be solidified while leaving other areas removable, in order to define the patterns. The areas to be removed or solidified are defined by insolation using a light wavelength to which the resin is sensitive. Such photosensitive resin is, in particular, used for protecting the covered areas against deposition of material or etching.

In an embodiment, all three-dimensional semiconducting structures 57 of the third light emitter 40A, 40B are embedded in a bulk 85 of resin containing particles P of the converting material.

An example of three-dimensional structure 57 embedded in a bulk 85 of resin containing particles P of the converting material is shown on the left of FIG. 2.

When the corresponding third semiconducting structure comprises at least one three-dimensional structure 57, the bulk of resin has a height, measured along the normal direction D, superior or equal to the height of the three-dimensional structures.

In case the third semiconducting structure is a two-dimensional structure, the corresponding bulk of resin covers, for example, at least partially an exposed surface of the third semiconducting structure.

In a variant, each particle P is attached to a third semiconducting structure.

An example of radiation converter 80 comprising particles P of converting material attached to a three-dimensional semiconducting structure 57 of a third semiconducting structure is shown on the right of FIG. 2.

For example, a surface of the third semiconducting structure is at least partially covered with the particles P. In the example shown on FIG. 2, the whole surface of each three-dimensional semiconducting structures 57 comprised in the third semiconducting structure is covered with a layer 82 of particles P.

Each particle P is, for example, attached to the surface of the third semiconducting structure by grafting.

Grafting is a method for attaching particles P to a surface, wherein the surface is covered by a layer able to attach the particles P to the surface. For example, the surface is functionalized using molecules M attached to the surface and able to allow each particle P to attach to the surface through the molecule M. In particular, one extremity of each molecule M is able to attach to a surface of the third semiconducting structure and another extremity is able to attach to a particle P of converting material so that the particle P is attached to the third semiconducting structure by the molecule M.

As is shown on FIG. 2, the radiation converter comprises a grafting layer 83 made of the molecules M, the layer 82 being attached to the surface of the third semiconducting structure by the grafting layer 83.

Such molecules M are sometimes called surface agents, bifunctional ligands, polyfonctional ligands, binders, linkers, capping agents, etc.

It should be noted that any functional organic molecule having at least two functional reactive groups may be used as molecule M in the present invention.

Examples of molecules M may be selected, for example, among the organosilane group, the thiol group, the acrylate group and the amine group.

The organosilane group includes, for example, 3-aminopropyltrimethoxysilane, 3-mercaptopropyltrimethoxysilane, 3-(methacryloyloxy)propyl trimethoxysilane and allyltrimethoxysilane.

The thiol group includes, for example, 1,6-hexanedithiol, trimethylolpropane tris(3-mercaptopropionate), pentaerythritol tetrakis(3-mercaptopropionate).

Example of acrylates are poly(ethyleneglycol)diacrylate, pentaerythritol triacrylate and pentaerythritol tetraacrylate.

Example of amine molecules M include bis(hexamethylene)triamine, bis(3-aminopropyl)amine, 3,3'-diamino-N-methyldipropylamine, etc.

The length of each molecule M is chosen so as to impose a mean distance between particles. The length of each molecule M is, in particular, chosen so as to limit a risk of absorption, by one particle P, of a third radiation emitted by a neighbouring particle P.

It should be noted that embodiments wherein several grafting layers 83 and several layers 82 of particles P are stacked may be considered. For example, one grafting layer 83 is used to attach a first layer 82 of particles P, each other layer 82 of particles P being attached to an underlying layer 82 of particles P by a grafting layer 83 interposed between both layers 82.

In the description above, each radiation converter 80 has been described as being attached to a surface of the corresponding first, second or third semiconducting structure. It should be noted that embodiments wherein any type of radiation converter 80 is attached to another surface of the corresponding third light emitter 40A, 40B may be considered. For example, the bulk of resin 85 or a layer 83 of molecules M may attach the particles P to a backside of the substrate 25 directly opposite the corresponding third semiconducting structure.

The control circuit is configured to inject an electrical current into each light emitter 30, 35, 40A and 40B.

In particular, the control circuit is configured to inject an electrical current into each LED structure of each light emitter 30, 35, 40A and 40B, for example into each three-dimensional semiconducting structure 57.

The control circuit is configured so that each electrical current flows through the n-doped layer, the emitting layer or layers and the p-doped layer of the corresponding LED structure.

For example, the control circuit comprises, for each LED structure, an electrical contact electrically connected to the core 60, in particular through the substrate 25, and an electrical contact electrically connected to the doped layer 75, and is able to impose an electrical voltage between both electrical contacts.

At least one of the electrical contacts is, for example, made of a transparent conductive material. In particular, the electrical contact electrically connected to the doped layer 75 is made of a transparent conductive material.

Indium-tin oxide is an example of such a transparent conductive material.

In an embodiment, each emitter 30, 35, 40A, 40B is separated from any other emitter 30, 35, 40A, 40B by a wall 95 extending onto the substrate 25.

For example, each wall 95 surrounds a corresponding emitter 30, 35, 40A, 40B in a plane perpendicular to the normal direction D.

Each wall 95 has a height superior or equal to the height of the three-dimensional structures 57, for example at least one micrometer more than the height of the three-dimensional structures 57. In an embodiment, the height difference between the wall 95 and the three-dimensional structures 57 is comprised between 1 µm and 2 µm.

The height of each wall 95 is, for example, inferior or equal to 15 µm.

Each wall 95 is configured to prevent a radiation emitted by one emitter 30, 35, 40A, 40B from reaching another emitter 30, 35, 40A, 40B.

Each wall 95 is, for example, configured to reflect the radiation. In a possible variant, the wall 95 is configured to absorb the radiation.

In particular, the wall 95 is configured to prevent the first, second or third radiation emitted by the emitter 30, 35, 40A, 40B from reaching any other emitter 30, 35, 40A, 40B.

In a variant, the wall 95 is configured to prevent the fourth radiation emitted by the semiconducting structure of an emitter 40A, 40B from exiting the emitter 40A, 40B.

The wall 95 is, for example, made of a photosensitive resin. In a possible variant, the wall is made of a metal such as aluminum. Walls 95 made of copper Cu or of a gold/copper alloy may also be considered.

In another variant, the wall 95 is made of silver, or made of a material covered with a silver layer.

In another embodiment, the wall 95 comprises a Bragg reflector. A Bragg reflector is a reflector consisting in a stack of layers made of different materials, the difference of optical indices between the different materials causing some optical radiations to be reflected by the reflector.

In an embodiment, a radiation filter covers at least one third light emitter 40A, 40B, 40C. The radiation filter covers, for example, each third light emitter 40A, 40B, 40C, or even covers each light emitter 30, 35, 40A, 40B, 40C.

The radiation filter is configured to prevent the fourth radiation to exit the third light emitter 40A, 40B, 40C, for example by absorbing any component of the fourth radiation that has not been converted by the radiation converter 80. In particular, the radiation filter forms a barrier between the radiation converter 80 and the outside atmosphere.

Several examples of emitting devices 15 will now be detailed.

The first example concerns an emitting device 15 comprising at least two native color light emitters 30, 35 and at least one converted light emitter 40A, 40B.

The second and third examples concern emitting devices 15 having at least two converted light emitters 40A, 40B, 40C, at least one of the light emitters having a radiation converter 80 made by grafting and at least one of the other light emitter(s) having a radiation converter 80 comprising particles embedded in a bulk of resin.

The fourth example concerns an emitting device having a least two converted light emitters 40A, 40B, each of the converters being excited by a radiation having a different wavelength from the radiation exciting the other converter.

FIRST EXAMPLE OF EMITTING DEVICE COMPRISING TWO NATIVE COLOR LIGHT EMITTERS AND AT LEAST ONE CONVERTED LIGHT EMITTER

A first example of display screen 10 is partially shown on FIG. 1.

The set of light emitters of the first example of display screen 10 comprises a first light emitter 30, a second light emitter 35 and at least one third light emitter 40A, 40B.

It should be noted that the number of first, second and third light emitters 30, 35, 40A, 40B may vary. For example, the emitting device 15 may comprise more than one first light emitter 30 and/or more than one second light emitter 35.

Furthermore, the number of third emitters 40A, 40B may be strictly superior to one. In the embodiment shown on FIG. 1, the emitting device 15 comprises two third light emitters 40A, 40B.

The first semiconducting structure comprises at least one three-dimensional semiconducting structure 57.

In the embodiment shown on FIG. 1, the first semiconducting structure comprises a set of three-dimensional semiconducting structure 57.

The second semiconducting structure comprises at least one three-dimensional semiconducting structure 57.

In the embodiment shown on FIG. 1, the second semiconducting structure comprises a set of three-dimensional semiconducting structures 57.

Each third semiconducting structure comprises at least one three-dimensional semiconducting structure 57.

In the embodiment shown on FIG. 1, each third semiconducting structure comprises a set of three-dimensional semiconducting structures 57.

As is mentioned above, both the first light emitter 30 and the second light emitter 35 are deprived of radiation converter 80, whereas both third light emitters 40A and 40B comprise each a respective radiation converter 80.

In the embodiment shown on FIG. 1, the radiation converter 80 of one third light emitter 40A comprises particles P embedded in a resin and the radiation converter 80 of another third light emitter 40B comprises particles P attached to the third semiconducting structure.

A method for fabricating an emitting device 15 is now detailed.

Figure 3:
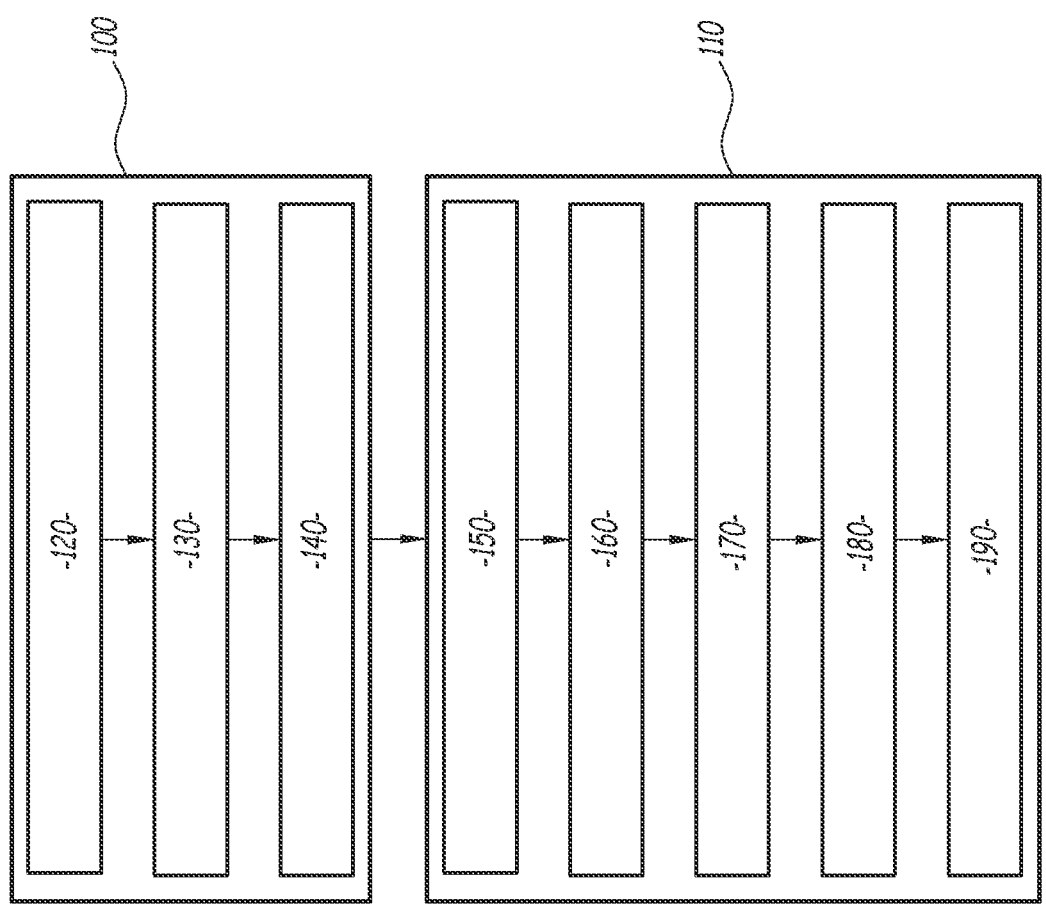
FIG. 3 is a flowchart illustrating the different steps of an example of method for fabrication an emitting device of FIG. 1.

A flowchart showing the order of the steps of an example of method for fabricating an emitting device 15 is shown on FIG. 3. In particular, the fabrication of the first example of emitting device 15 is described. However, the extension of this method to the fabrication of other examples of emitting devices 15 is immediate.

The method comprises a step for fabricating 100 and a step for positioning 110.

During the step for fabricating 100, each first, second and third semiconducting structure is fabricated.

The step for fabricating 100 comprises a step for providing 120, a step for depositing 130 and a step for processing 140.

During the step for providing 120, the substrate 25 is provided in a deposition chamber.

The substrate 25 comprises a support for each first, second and third semiconducting structure.

For example, when a first, second or third semiconducting structure is a two-dimensional structure, the corresponding support comprises the n-doped or p-doped layer that is the closest to the substrate 25.

When a first, second or third semiconducting structure comprises at least one three-dimensional structure 57, the support comprises the core 60 of each three-dimensional structure 57.

Each support is, for example, provided by depositing the core material onto the substrate 25.

Many deposition techniques may enable to obtain such a support.

For example, Metal-Organic Chemical Vapor Deposition (MOCVD) is a way to obtain microwire cores, in particular when material is selectively deposited in the holes of the electrically insulating layer of the substrate 25.

MOCVD is also called "MOVPE", which stands for "Metal-Organic Vapor Phase Epitaxy". Other Chemical Vapor Deposition (CVD) methods may also be envisioned.

However, other deposition techniques may be used, such as Molecular Beam Epitaxy (MBE), Gas-source MBE (GSMBE), Metal-Organic MBE (MOMBE), Plasma-assisted MBE (PAMBE), Atomic-layer Epitaxy (ALE), or Hydride Vapor Phase Epitaxy (HVPE).

At the end of the step for providing 120, the substrate 25 comprising the supports corresponding to each first, second or third semiconducting structure is thus provided in the deposition chamber.

In a variant, the supports corresponding to each first, second or third semiconducting structure are fabricated in a different deposition chamber than the chamber in which the substrate 25 comprising the supports corresponding to each first, second or third semiconducting structure is present at the end of the providing step.

During the step for depositing 130, each first, second and third semiconducting layer is fabricated by depositing, respectively, the first, second and third emitting material onto the supports corresponding to, respectively, the first, second and third semiconducting structure.

For example the first, second and third emitting materials are deposited simultaneously on the corresponding supports.

A step for depositing 130 during which the supports are cores 60 of three-dimensional structures 57 is an example of such a simultaneous deposition step 130. Indeed, the variation of filling factor and/or core diameter from one light emitter 30, 35, 40A and 40B to another leads the composition and/or thickness of the deposited first, second and third emitting material to be different from one another, even if the first, second and third emitting material have been deposited simultaneously in the same conditions.

In a variant, several successive deposition steps are performed to obtain the first, second and third semiconducting layers.

At the end of the deposition step, the first, second and third semiconducting structures are obtained.

For example, the doped layer 75 is deposited on the emitting layer or layers 70 of each three-dimensional structure 57.

When a first, second and third semiconducting structure is a two-dimensional structure, the layer, among the n-doped or p-doped layers, that is the furthest from the substrate 25 is deposited onto the emitting layer or layers.

During the step for processing 140, the electrical contacts are formed.

During the step for positioning 110, the radiation converter 80 of each third light emitter is positioned.

The step for positioning 110 comprises a step for masking 150, a step for functionalizing 160, a step for depositing a converter 170, a step for removing 180 and a step for finishing 190.

During the step for masking 150, the first and second semiconducting structure are covered by a photosensitive resin, as well as any third semiconducting structure whose associated radiation converter 80 does not comprises particles P grafted to the third semiconducting structure.

Figure 4:
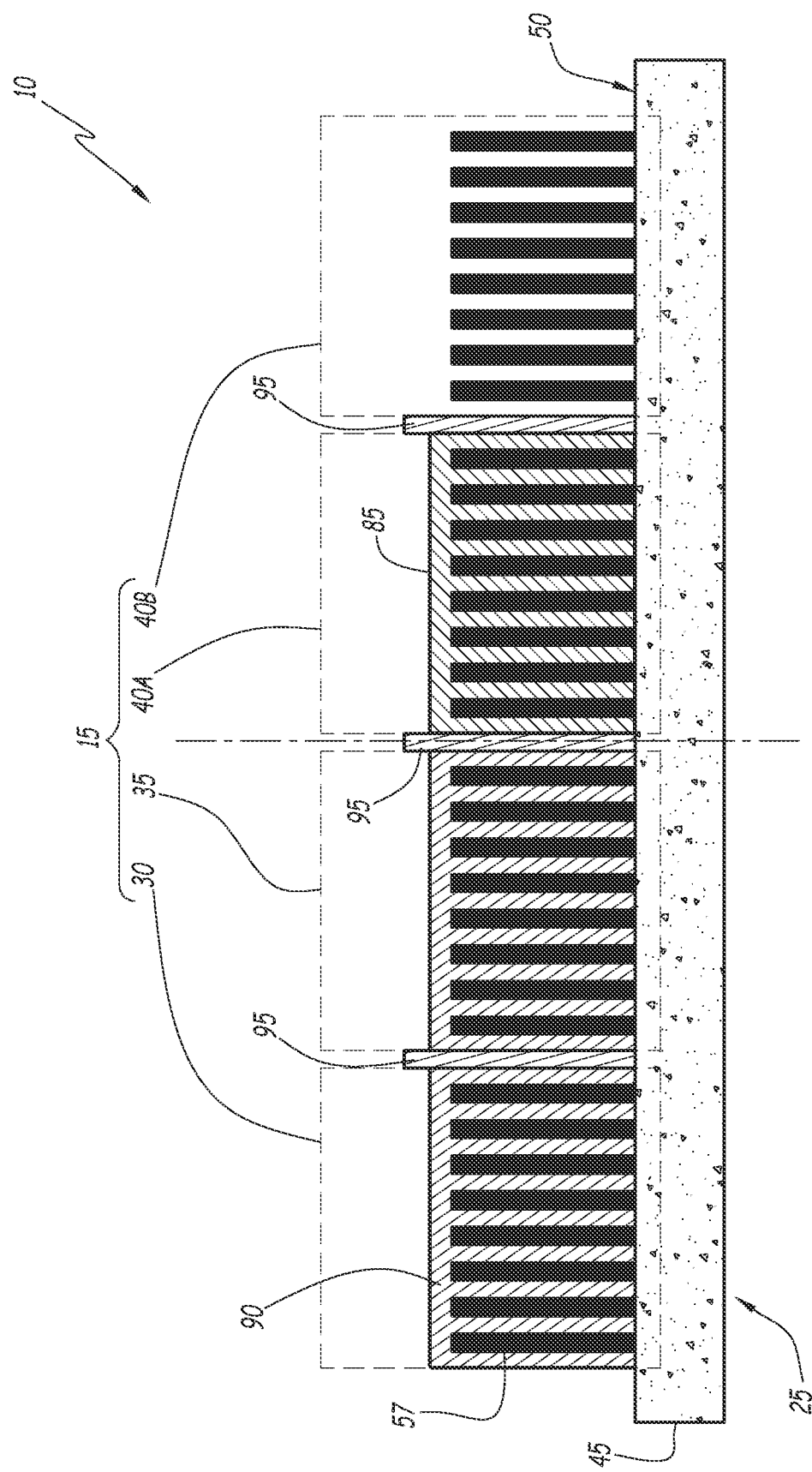
FIG. 4 is a partial side view of the display screen of FIG. 1 at the end of a specific step of the method for fabricating an emitting device of FIG. 1.

An example of the state of the substrate 25 and the different semiconducting structures at the end of the step for masking 150 is shown on FIG. 4.

In the example shown on FIG. 4, the third semiconducting structure of one of the third light emitters 40A is covered in photosensitive resin during the masking step 150. The third semiconducting structure of the other third light emitter 40B is not covered in photosensitive resin.

In an embodiment, the third semiconducting structure of the third light emitter 40A is covered with a first bulk 85 of photosensitive resin and the first and second semiconducting structure are covered by a second bulk 90 of photosensitive resin.

The first bulk 85 comprises, for example, particles P of a converting material so that the first bulk 85 forms the radiation converter 80 of the third light emitter 40A.

During the step for functionalizing 160, the molecules M are deposited onto the third semiconducting structure of the third light emitter 40B so as to form the grafting layer 83.

For example, the area where the molecules M are to be deposited is defined by masking. In particular, a photoresist is deposited onto the substrate 25 and onto the different semiconducting structures, for example by spin-coating. The photoresist is then selectively insolated and part of the photoresist is removed so as to leave only the third semiconducting structure of the third emitter 40B free of photoresist.

The surface of the semiconducting structure of the third emitter 40B is then activated by exposure to an ozone flux or to an ultraviolet light.

The activated surface is then functionalized with a layer 83 of molecules M.

At the end of the functionalizing step 160, the surface of the semiconducting structure of the third emitter 40B is thus covered with a layer 83 of molecules M that are each attached to the surface of the semiconducting structure.

Each molecule M is, in particular, attached to the surface by one of the functional reactive groups of the molecule M.

The step for depositing a converter 170 is also called "grafting step".

During the step for depositing a converter 170, the particles P are deposited onto the grafting layer 83. Each particle P is attached to the surface of the third semiconductor structure by one or several of the molecules M of the grafting layer 83. The layer 82 of particles P is thus formed and attached to the third semiconductor structure.

In particular, each particle P is attached to the molecule M by one of the functional reactive groups of the molecule M.

At the end of the step 170 for depositing a converter, a layer 82 of particles P is thus attached to the semiconducting structure of the third emitter 40B by the layer 83 of molecules M.

It should be noted that steps 160 and 170 may be repeated so that a set of stacked layers 82 and 83 is formed.

During the step for removing 180, the second bulk of resin 90 is removed.

If a first bulk 85 of resin is present, the first bulk 85 is not removed.

During the step for finishing 190, the emitting device 15 is completed.

For example, each electrical contact that has not already been fabricated is fabricated during the step for finishing 190. Every electrical contact is connected to the control circuit.

The emitting device 15 is, for example, covered in a transparent passivation layer so that each three-dimensional structure 57 is embedded in the passivation layer.

Furthermore, the emitting device 15 is integrated with other emitting device 15 to form the pixels of the display screen 10.

The method further comprises, optionally, a step for forming the walls 95.

The step for forming the walls 95 is, for example, performed after the step for depositing 130 and before the step for processing 140.

The walls 95 are, for example, formed by depositing a layer of an opaque photosensitive resin and by locally insolating the layer of opaque resin to define the walls 95.

Other material deposition techniques may be considered for forming the walls 95, for example MOCVD, MOVPE, other CVD methods, MBE, GSMBE, MOMBE, PAMBE, ALE, HVPE, electrodeposition or sputtering.

The first example of display screen 10 is described above in a case where each emitting device 15 comprises a first light emitter 30, a second light emitter 35 and two third light emitters 40A, 40B, each third light emitter 40A, 40B having a radiation converter 80 made with a technique (embedding in a resin bulk 85 or grafting) different from the technique used for the radiation converter 80 of the other third light emitter 40A, 40B.

It should be noted that variants of the first example may include a single third light emitter 40A, 40B, or two third light emitters 40A, 40B using a same technique for forming their respective radiation converters 80. In this case, of the step for positioning 110, only the corresponding steps among steps 150 to 190 are performed.

In the example above, the grafting layer 83 has been described as being either deposited only on the parts of the surface of the third semiconducting structure to which the corresponding particles P are to be attached.

It should be noted that embodiments wherein the grafting layer 83 is deposited onto a larger surface than the surface to which the particles P must be attached and locally removed after the deposition of the particles P are also envisioned. For example, a first portion 86 and a second portion 87 of the grafting layer 83 are deposited, the particles P are attached to both the first portion 86 and the second portion 87, and the second portion is removed after deposition of the particles P, thereby leaving particles P attached only to the first portion 86.

A plasma etching of the second portion 87 is an example of method for locally removing part of the grafting layer 83.

Since two light emitters 30, 35 are deprived of radiation converter 80, the number of steps implied to deposit the radiation converter or converters 80 is reduced. The risk of intermixing between the radiation converters 80 is therefore reduced. In consequence, the ranges of wavelengths emitted by each emitting device 15 is well controlled even if the dimensions of the emitting device 15 are reduced. The dimension of the display screen 10 is thus reduced, and the resolution of the display screen 10 is improved.

The presence of the walls 95 further reduce the risk of cross-talk between neighboring light emitters 30, 35, 40A, 40B and 40C, since such walls 95 reduce the risk that the light emitted by one light emitter 30, 35, 40A, 40B and 40C reaches another light emitter 30, 35, 40A, 40B and 40C The resolution of the display screen is thus also improved.

Furthermore, the presence of the walls 95 allows for an easier placement of the radiation converter 80, since the walls 95 form a barrier limiting the risk that the particles P deposited onto one semiconducting structure are also deposited onto another semiconducting structure.

Three-dimensional structures, and in particular microwires, allow for the first and second semiconducting structure to emit radiations having different mean wavelengths even if the corresponding emitting materials are deposited simultaneously in the same conditions. Such a difference is in particular controlled precisely if the filling factor and/or mean diameter vary between the first and second semiconducting structures.

Two-dimensional structures are more easily fabricated than three-dimensional structures.

Particles P of a converting material may be easily deposited using a number of different techniques.

In particular, the deposition of particles P embedded in a resin is easy and requires only standard techniques that are commonly used in the field of electronics and thus easily controlled. The radiation converter 80 thus obtained is therefore very stable during the subsequent processing steps.

Grafting does not require a step for insolating the particles P with a specific optical radiation, since the area where the particles P will be attached is defined by positioning the grafting layer 83 before the particles P are deposited. Therefore, no scattering of the optical radiation by the particles P occur, and the positioning of the radiation converter is therefore very precise. The dimensions of the emitting device 15 may here again be reduced without compromising the color purity.

Furthermore, grafting allows for a high surface density of particles P and therefore for an efficient conversion of the fourth radiation into the third radiation.

The molecules M do not attach to photosensitive resin. Therefore, when one third light emitter 40A comprises particles P embedded in a resin and another third light emitter 40B comprises particles P attached by grafting, intermixing of both radiation converters 80 is avoided, even when the dimensions of the emitting device 15 are reduced.

Semiconducting structures emitting efficiently blue or green light usually exhibit a poor efficiency when adapted to emit red light. In particular, the materials adapted to emit blue or green light are usually different from those adapted to emit red or white light. If the fourth radiation(s) is or are identical to one of the first and second radiation, or if the third radiation is either a red or white light, the manufacturing of the emitting device 15 is therefore simplified, since all semiconducting structures may be made of the same family of materials and may be identical or similar to each other, while keeping a good overall emission efficiency for each of the first, second and third radiation.

When neutral particles are mixed with quantum dots in the set of particles P, the mean distance between quantum dots may be controlled so as to limit absorption, by a quantum dot, of the third radiation emitted by another quantum dot. The overall emission efficiency is therefore increased.

The different semiconducting structures have been described hereabove in the case where each semiconducting material is a III-Nitride material. However, other semiconducting materials may be used.

Furthermore, the first, second and third semiconducting structures have been described on FIGS. 1 to 5 as comprising each a set of three-dimensional structures. However, any of the first, second and third semiconducting structures may be a single two-dimensional structure.

While the first example of display screen 10 and its variant allow for an improved spatial resolution by using at least two light emitters 30, 35 deprived of radiation converter 80, other examples of display screen using one light emitter 30, 35 or less may also provide an improved spatial resolution with respect to the existing screens 15.

In each of the following examples, improved spatial resolution is attained by changing at least one feature of each third light emitter 40A, 40B, 40C with respect to the other third light emitter(s) 40A, 40B and 40C.

SECOND EXAMPLE OF EMITTING DEVICE COMPRISING AT LEAST TWO CONVERTED LIGHT EMITTERS USING DIFFERENT TECHNOLOGIES

In a second example, this improved spatial resolution is attained by using different techniques for the different radiation converters 80.

The second example of display screen 10 will now be described. All elements identical to those of the first example of FIGS. 1 to 4 are not described again. Only the differences are detailed in the following.

Figure 5:
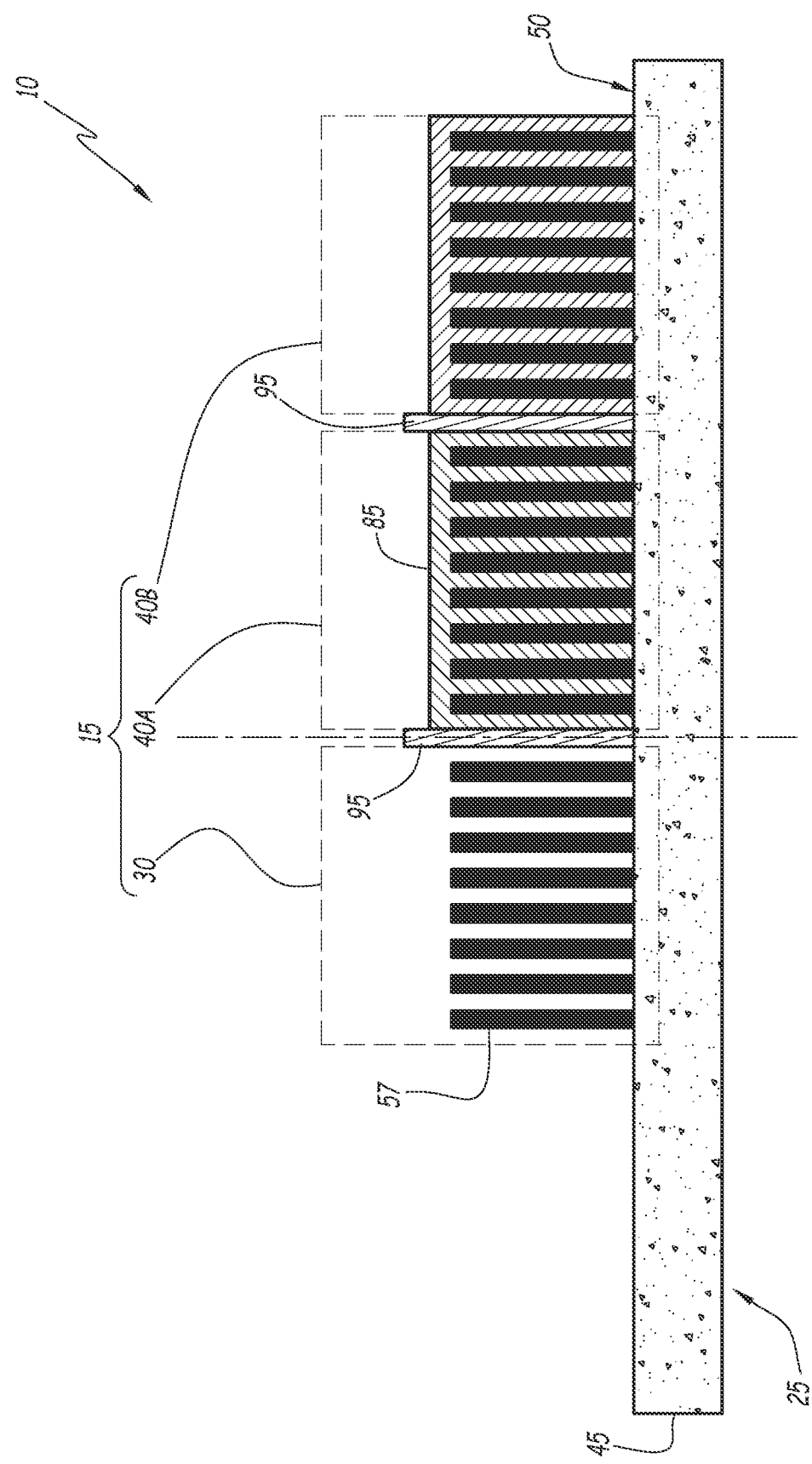
FIG. 5 is a partial side view of a second example of display screen comprising a set of emitting devices comprising three-dimensional structures.

The second example of display screen 10 is shown on FIG. 5.

Each emitting device 15 comprises at least two third light emitters 40A, 40B and a first light emitter 30. The emitting device 15 does not comprise any second light emitter 35.

It should be noted that embodiments of the second example wherein the emitting device 15 does not comprise any first light emitter 30 may also be considered.

Each first and third semiconducting structure of the second example of emitting device 15 is, for example, a two-dimensional structure. However, embodiments wherein one or several of the first and third semiconducting structure comprises one of a set of three-dimensional structures 57 may be considered. In the embodiment shown on FIG. 5, each semiconducting structure comprises a respective set of three-dimensional structures 57.

In an embodiment, the first and third semiconducting structures are identical to one another.

The first radiation emitted by the first light emitter 30 is, for example, a blue light.

As is the case for the first example, the radiation converters 80 of the third light emitters 40A and 40B are made, respectively, by embedding particles in a bulk of resin 85 and by grafting.

The third radiation emitted by each third light emitter 40A, 40B is chosen among a green light and a red light.

In an embodiment, the mean wavelength of the third radiation emitted by the third light emitter 40A whose radiation converter 80 is made by grafting is strictly inferior to the mean wavelength of the third radiation emitted by the third light emitter 40B whose radiation converter 80 comprises a set of particles P embedded in a resin bulk 85. For example, the third radiation emitted by the third light emitter 40B is a green light and the third radiation emitted by the third light emitter 40A is a red light, or vice-versa.

The emitting device 15 of the second example of display screen 10 is fabricated using the method detailed on FIG. 3, no second semiconducting structure being fabricated during the step 100 for fabricating.

The second example does not require that at least two of the light emitters emitting different radiations are deprived of radiation converter. This second example is therefore easier to manufacture than the first example. In particular, all the semiconducting structures may be identical, only the radiation converters 80 being different or absent from one light emitter 30, 40A, 40B to another.

If the third light emitter 40B whose radiation converter 80 comprises particles P attached by grafting is configured to emit a third radiation having a lower mean wavelength than the third radiation emitted by the other third light emitter 40A, the emission efficiency of the third radiation may be relatively high despite the relatively low conversion efficiency of the converting materials which are adapted to emit radiations exhibiting shorter mean wavelengths. This is notably true if the mean wavelength of the third radiation emitted by the third light emitter 40B is a green radiation, since materials for converting radiation into green light usually exhibit lower efficiency than those converting radiation into red light.

This comes from the very high surface density of particles P that may be achieved by grafting.

Owing to the different techniques for placing the converters 80 on each third light emitter 40A and 40B, the positioning accuracy of the particles P is very high, as has been described with reference to the first example, and the risk of converter intermixing is reduced. The wavelength control of each light emitter 30, 40A, 40B is thus improved.

THIRD EXAMPLE OF EMITTING DEVICE COMPRISING AT LEAST THREE CONVERTED LIGHT EMITTERS

A third example of display screen 10 is now described. All elements identical to those of the second example are not described again. Only the differences are detailed.

The third example of display screen 10 is shown on FIG. 6.

Each emitting device 15 of the third example comprises at least three third light emitters 40A, 40B and 40C.

Each emitting device 15 is deprived of first or second light emitter 30, 35. In other words, each emitting device 15 does not contain any light emitter 30, 35 deprived of radiation converter 80.

The third radiation emitted by each third light emitter 40A, 40B and 40C is chosen among a blue light, a green light and a red light.

In an embodiment, the third light emitter 40A emitting a red light comprises a radiation converter made at least partially of particles P embedded in a photosensitive resin, whereas the third light emitter 40B emitting a blue light comprises a radiation converter made at least partially of particles P attached by grafting.

The radiation converter of the third light emitter 40C is chosen among a radiation converter made at least partially of particles P embedded in a photosensitive resin and a radiation converter made at least partially of particles P attached by grafting.

Each fourth radiation is, for example, an ultraviolet light. Embodiments wherein the fourth radiation of some or all emitters 30, 35, 40A, 40B, 40C is a blue light may be envisioned.

The emission of some semiconducting structures in the ultraviolet range is more efficient than in the visible range. The overall efficiency of the emitting device 15 is therefore improved.

In the second and third examples above, the properties that vary from one third light emitter 40A, 40B, 40C to another are properties of the respective radiation converters 80, notably the type of technique used to attach the particles P to a surface. However, it will appear below that properties of the third semiconducting structures may also be varied, while using identical radiation converters 80 for each third light emitter 40A, 40B, 40C.

FOURTH EXAMPLE OF EMITTING DEVICE COMPRISING TWO CONVERTED LIGHT EMITTERS EXCITED USING DIFFERENT WAVELENGTHS

A fourth example of display screen 10 is now described. All elements identical to those of the second example are not described again. Only the differences are detailed.

The fourth example of display screen 10 is shown on FIG. 7.

Each emitting device 15 comprises at least two third light emitters 40A, 40B. For example, the emitting device 15 comprises two third light emitters 40A, 40B and a first light emitter 30. In a variant, the emitting device 15 may also comprise a second light emitter 35.

The third semiconducting structures of each third light emitter 40A, 40B are different from each other. In particular, the fourth radiations emitted by the third semiconducting structures of both light emitters 40A, 40B are different from each other. For example, the third semiconducting structure of light emitter 40A is configured to emit a fourth radiation R1 and the third semiconducting structure of light emitter 40B is configured to emit a fourth radiation R2 different from fourth radiation R1.

In particular, the mean wavelengths of fourth radiations R1 and R2 are different from each other. A wavelength difference between the mean radiations of fourth radiations R1 and R2 is, for example, superior or equal to 40 nm.

In an embodiment, the fourth radiation R1 is a blue radiation and the fourth radiation R2 is an ultraviolet radiation.

The radiation converters 80 of both third light emitters 40A, 40B are identical to each other.

In particular, each radiation converter 80 comprises a set of particles P.

In an embodiment, a single radiation converter 80 is used for both third light emitters 40A, 40B. For example, the single radiation converter 80 covers both third semiconducting structures, as shown on FIG. 7.

The particles P are, for example, either attached to a surface of each third light emitter 40A, 40B by a single grafting layer 83 or embedded in a single bulk of photosensitive resin 85.

The set of particles P is a mixture comprising a set of first particles P1 and a set of second particles P2.

Each first particle P1 is able to convert the fourth radiation R1 emitted by the third semiconducting structure of the third light emitter 40A into the corresponding third radiation.

Each second particle P2 is able to convert the fourth radiation R2 emitted by the third semiconducting structure of the third light emitter 40B into the corresponding third radiation.

The first particles P1 are transparent to the third radiation emitted by the second particles P2, and the second particles P2 are transparent to the third radiation emitted by the first particles P1.

At least one of the first particle P1 and the second particle P2 is transparent to one of the fourth radiations R1 and R2. In an embodiment, each first particle P1 is transparent to the fourth radiation R2 of the third light emitter 40B and each second particle P2 is transparent to the fourth radiation R1 of the third light emitter 40A.

In a variant, each first particle P1 is able to convert both fourth radiations R1 and R2 into the third radiation corresponding to the third light emitter 40A, or each second particle P2 is able to convert both fourth radiations R1 and R2 into the third radiation corresponding to the third light emitter 40B.

Particles P1 and P2 may differ by their composition and/or their size.

For example, particles P1 and P2 are made of a same material, for example a semiconductor material, but are doped with different elements. In an embodiment, particles P1, P2 are made of ZnSe, the first particles P1 being Mn-doped so as to emit a red third radiation and the second particles P2 being Cu-doped so as to emit a green third radiation.

In some embodiments, the particles P1, P2 are made of different materials. For example, the first particles P1 are made of Mn-doped ZnSe while the second particles P2 are made of InP.

In other embodiments, the particles P1, P2 are made of a same semiconductor material, but the size of the particles P1 and P2 differ so as to result in different quantum confinement and thus different radiation emission/absorption properties. For example, particles P1 and P2 are each made of Mn-doped ZnSe.

It should be noted that, although the fourth example is detailed above in the case of two third light emitters 40A, 40B whose radiation converter 80 comprises a mixture of two types of particles P1, P2, other embodiments comprising at least three third light emitters 40A, 40B, 40C and a radiation converter 80 comprising a mixture of at least three types of particles may also be envisioned.

The method for fabricating the fourth example of emitting device will now be described.

The steps identical to those of the method for fabricating an emitting device of FIG. 3 are not described again. Only the differences are highlighted.

During the step for fabricating 100, the third semiconducting layers of each third light emitter 40A, 40B are different from one another, so as to be able to emit different fourth radiations R1, R2.

For example, the diameter and/or the pitch of three-dimensional structures 57 differ between both third semiconducting structures, so that the step for depositing 130 results in different third semiconducting layers.

During the step for depositing 110, a mixture of first particles P1 and second particles P2 is deposited. In particular, the mixture is deposited simultaneously on corresponding surfaces of the third light emitter 40A and of the third light emitter 40B.

For example, the step for depositing 110 comprises the simultaneous deposition of a single bulk of resin 85 onto surfaces of both third light emitters 40A and 40B, for example onto surfaces of both third semiconducting structures.

In a variant, the step for depositing 110 comprises the step for functionalizing 130 and the step for depositing a converter 170.

During the step for functionalizing 130, the grafting layer 83 is deposited onto the corresponding surfaces of both third light emitters 40A and 40B.

For example, a grafting layer 83 of molecules M is deposited onto both surfaces.

During the step for depositing the converter 170, the mixture of particles P1, P2 is deposited onto the grafting layer 83. In particular, the mixture of particles P1, P2 is deposited so as to be simultaneously attached to the surfaces of both third light emitters 40A and 40B.

By using a mixture of particles P1, P2 and different fourth radiations R1, R2, the risk of converter intermixing is eliminated. The spatial resolution of the emitting device 15 is limited only by the lateral size of each light emitter 40A, 40B, or by the accuracy with which the radiation filter is patterned.

This is particularly true if each type of particles P1, P2 is transparent to a respective fourth radiation R1, R2, since only one type of particles is then activated by each fourth radiation, resulting in a good color control of each third emission.

However, if one type of particles P1, P2 is able to absorb both fourth radiations R1, R2, this results in an emitting device in which the fourth radiation R1, R2 of a light emitter 40A, 40B may be converted into a third radiation by one type of particles P1, P2 while the fourth radiation R1, R2 of the other light emitter 40A, 40B may be converted into a third radiation by both types of particles P1, P2. Thus, the third radiation corresponding to the other light emitter 40A, 40B may have a broader optical spectrum, such as a white light.

In an embodiment of the fourth example, the radiation filters used for each light emitter 40A, 40B are different.

Notably, the radiation filter of third light emitter 40A is configured to be traversed by the third radiation of third light emitter 40A (emitted by the first particles P1) and to form a barrier to the fourth radiation of third light emitter 40B (emitted by the second particles P2). The radiation filter of third light emitter 40B is configured to be traversed by the third radiation of third light emitter 40B (emitted by the second particles P2) and to form a barrier to the fourth radiation of third light emitter 40A (emitted by the first particles P1). This embodiment therefore allows for using particles P1, P2 that are not transparent to the fourth radiation R1, R2 that the particles are not configured to convert, as any undesired third radiation resulting from the conversion of the radiation R1 by the particles P2, or from the conversion of the radiation R2 by the particles P1, is filtered by the filter.

As a radiation filter is easy to design with a greater accuracy than the deposition accuracy of radiation converters 80, this embodiment has a better spatial resolution than existing emitting devices 15, while being compatible with a greater range of particles P1, P2.

In a specific example of this embodiment, the fourth radiations R1 and R2 are identical, only the radiation filters are different for the third light emitters 40A and 40B.

The invention corresponds to any possible combination of the examples detailed hereabove.

Glossary

Doping

Doping is defined as the presence, in a material, of impurities bringing free charge carriers. Impurities are, for example, atoms of an element that is not naturally present in the material.

When the impurities increase the volumic density of holes in the material, with respect to the undoped material, the doping is p-type. For example, a layer of GaN is p-doped by adding magnesium (Mg) atoms.

When the impurities increase the volumic density of free electrons in the material, with respect to the undoped material, the doping is n-type. For example, a layer of GaN is n-doped by adding silicon (Si) atoms.

LED Structure

A LED structure is a semiconducting structure comprising several semiconducting areas forming a P-N junction and configured to emit light when an electrical current flows through the different semiconducting areas.

A two-dimensional structure comprising an n-doped layer, a p-doped layer and at least one emitting layer is an example of LED structure. In this case, each emitting layer is interposed, along the normal direction D, between the n-doped layer and the p-doped layer.

In an embodiment, each emitting layer has a bandgap value strictly inferior to the bandgap value of the n-doped layer and strictly inferior to the bandgap value of the p-doped layer. For example, both the n-doped layer and the p-doped layer are GaN layers and each emitting layer is an InGaN layer.

The emitting layer is, for example, undoped. In other embodiments, the emitting layer is doped.

A quantum well is a specific example of emitting layer having a lower bandgap value than bandgap values of the n-doped and p-doped layers.

Quantum Well

A quantum well is a structure in which quantum confinement occurs, in one direction, for at least one type of charge carriers. The effects of quantum confinement take place when the dimension of the structure along that direction becomes comparable to or smaller than the de Broglie wavelength of the carriers, which are generally electrons and/or holes, leading to energy levels called "energy sub-bands".

In such a quantum well, carriers may have only discrete energy values but are, usually, able to move within a plane perpendicular to the direction in which the confinement occurs. The energy values available to the carriers, also called "energy levels", increase when the dimensions of the quantum well decrease along the direction in which the confinement occurs.

In quantum mechanics, the "de Broglie wavelength", is the wavelength of a particle when the particle is considered as a wave. The de Broglie wavelength of electrons is also called "electronic wavelength". The de Broglie wavelength of a charge carrier depends of the material of which the quantum well is made.

An example of quantum well is an emitting layer having a thickness strictly inferior to the product of the electronic wavelength of the electrons in the semiconducting material of which the emitting layer is made with five.

Another example of quantum well is an emitting layer having a thickness strictly inferior to the product of the de Broglie wavelength of excitons in the semiconducting material of which the emitting layer is made with five. An exciton is a quasiparticle comprising an electron and a hole.

In particular, a quantum well often has a thickness comprised between 1 nm and 200 nm.

Quantum Dot

A quantum dot is a structure in which quantum confinement occurs in all three spatial dimensions.

So as to give an order of value, a particle P having a maximal dimension comprised between 1 nm and 1 µm and made of a semiconducting converter material is an example of quantum dot.

Semiconducting Material

The expression "bandgap value" shall be understood as meaning the value of the forbidden band between the valence band and the conduction band of the material.

The bandgap value is, for example, measured in electronvolts (eV).

The valence band is defined as being, among the energy bands which are allowed for electrons in the material, the band that has the highest energy while being completely filled at a temperature inferior or equal to 20 Kelvin (K).

A first energy level is defined for each valence band. The first energy level is the highest energy level of the valence band.

The conduction band is defined as being, among the energy bands which are allowed for electrons in the material, the band that has the lowest energy while not being completely filled at a temperature inferior or equal to 20 K.

A second energy level is defined for each conduction band. The second energy level is the highest energy level of the conduction band.

Thus, each bandgap value is measured between the first energy level and the second energy level of the material.

A semiconductor material is a material having a bandgap value strictly superior to zero and inferior or equal to 6.5 eV.

A direct bandgap semiconductor is an example of semiconductor material. A material is said to have a "direct bandgap" when the minimum of the conduction band and the maximum of the valence band correspond to a same value of charge carrier momentum. A material is said to have an "indirect bandgap" when the minimum of the conduction band and the maximum of the valence band correspond to different values of charge carrier momentum.

Three-Dimensional Structure

A three-dimensional structure is a structure extending along a main direction. The three-dimensional structure has a length measured along the main direction. The three-dimensional structure also has a maximum lateral dimension measured along a lateral direction perpendicular to the main direction, the lateral direction being the direction perpendicular to the main direction along which the dimension of the structure is the largest.

The maximum lateral dimension is, for example, smaller than or equal to 10 micrometers (μm), and the length is superior or equal to the maximum lateral dimension. The maximum lateral dimension is advantageously inferior or equal to 2.5 μm.

The maximum lateral dimension is, notably, greater than or equal to 10 nm.

In specific embodiments, the length is superior or equal to twice the maximum lateral dimension, for example superior or equal to five times the maximum lateral dimension.

The main direction is, for example, the normal direction D. In this case, the length of the three-dimensional structure is called "height" and the maximum dimension of the three-dimensional structure, in a plane perpendicular to the normal direction D, is smaller than or equal to 10 μm.

The maximum dimension of the three-dimensional structure, in a plane perpendicular to the normal direction D, is often called "diameter" irrespective of the shape of the three-dimensional structure's cross-section.

For example, each three-dimensional structure is a microwire. A microwire is a cylindrical three-dimensional structure.

In a specific embodiment, the microwire is a cylinder extending along the normal direction D. For example, the microwire is a cylinder with a circular base. In this case, the diameter of the cylinder's base is inferior or equal to half the length of the microwire.

A microwire whose maximum lateral dimension is smaller than 1 μm is called "nanowire".

A pyramid extending along the normal direction D from the substrate 25 is another example of three-dimensional structure.

A cone extending along the normal direction D is another example of three-dimensional structure.

A truncated cone or truncated pyramid extending along the normal direction D is another example of three-dimensional structure.

The invention claimed is:

1. An emitting device comprising:
a first light emitter, the first light emitter being adapted to emit a first radiation, and
a second light emitter, the second light emitter being adapted to emit a second radiation, the second radiation being different from the first radiation,
the first light emitter comprising a first semiconducting structure and a first radiation converter, the second light emitter comprising a second semiconducting structure and a second radiation converter, each semiconducting structure comprising a semiconducting layer adapted to emit a third radiation different from the first radiation and the second radiation, each radiation converter comprising a set of particles, each particle being able to convert the third radiation into the first or second radiation emitted by a corresponding light emitter,
the particles of the first radiation converter being attached by a bulk of photosensitive resin to a surface of the first light emitter, and the particles of the second radiation converter being attached by grafting to a surface of the second light emitter.

2. The emitting device according to claim 1, wherein the second radiation converter comprises a stack of at least one layer of particles and at least one grafting layer of organic molecules, the layer of particles being attached to the surface of the second light emitter by the at least one grafting layer.

3. The emitting device according to claim 1, wherein a mean wavelength of the second radiation is strictly inferior to a mean wavelength of the first radiation.

4. The emitting device according to claim 1, further comprising at least one third emitter, the at least one third emitter being adapted to emit a fourth radiation, the fourth radiation being different from the first radiation and the second radiation, the at least one third emitter comprising at least one third semiconducting structure, the third semiconducting structure comprising a third semiconducting layer, the third semiconducting layer being adapted to emit the fourth radiation.

5. The emitting device according to claim 1, further comprising at least one fourth light emitter, the fourth light emitter being adapted to emit a fifth radiation, the fifth radiation being different from the first radiation and the second radiation,
the fourth light emitter comprising a fourth semiconducting structure and a fourth radiation converter, the fourth semiconducting structure comprising the semiconducting layer adapted to emit the third radiation different from the fifth radiation, the fourth radiation converter of the fourth light emitter comprising a set of particles, each particle being able to convert the third radiation into the fifth radiation.

6. The emitting device according to claim 1, further comprising at least one wall able to prevent a radiation emitted by one light emitter from reaching another light emitter.

7. A display screen comprising at least one emitting device according to claim 1.

8. The emitting device according to claim 1, wherein the surface of the second light emitter is a surface of the second semiconducting structure.

9. A method for fabricating an emitting device comprising
a first light emitter, the first light emitter being adapted to emit a first radiation, and
a second light emitter, the second light emitter being adapted to emit a second radiation, the second radiation being different from the first radiation,
the method comprising steps for:
fabricating at least one first semiconducting structure for the first light emitter and at least one second semiconducting structure for the second light emitter, the first semiconducting structure comprising a first semiconducting layer, the second semiconducting structure comprising a second semiconducting layer, each of the first and second semiconducting layer being adapted to emit a third radiation different from the first radiation and the second radiation,
positioning, onto a surface of the first light emitter, a bulk of photosensitive resin comprising particles able to convert the third radiation of the first semiconducting layer into the first radiation,
depositing, onto to a surface of the second light emitter, a grafting layer, and
depositing, onto the grafting layer, a layer of particles able to convert the third radiation of the second semiconducting layer into the second radiation, each particle being attached to the surface of the second light emitter by the grafting layer.

10. An emitting device comprising:
a first light emitter, the first light emitter being adapted to emit a first radiation, the first light emitter comprising at least one first semiconducting structure, the first semiconducting structure comprising a first semiconducting layer, the first semiconducting layer being adapted to emit a second radiation, and at least one second light emitter, each second light emitter being adapted to emit a third radiation, the third radiation being different from the first radiation, the second light emitter comprising at least one second semiconducting structure, the second semiconducting structure comprising a second semiconducting layer adapted to emit a fourth radiation, each light emitter further comprising a radiation converter, each radiation converter comprising a mixture of first particles and second particles, each first particle being able to convert the second radiation into the first radiation, each second particle being able to convert the fourth radiation into the third radiation.

11. The emitting device of claim 10, wherein each first particle is transparent to the second radiation and each second particle is transparent to the fourth radiation.

12. The emitting device of claim 10, further comprising at least one of the following:

the mixture of first particles and second particles is embedded in a photosensitive resin, the mixture of first particles and second particles is attached to a surface of the first and second light emitters by grafting, and one radiation among the second radiation and the fourth radiation is an ultraviolet radiation, the other radiation among the second radiation and the fourth radiation being a blue radiation.

13. A method for fabricating an emitting device comprising a first light emitter and at least one second light emitter, the first light emitter being adapted to emit a first radiation, each second light emitter being adapted to emit a third radiation, the third radiation being different from the first radiation, the method comprising steps for:

providing at least one first semiconducting structure for the first light emitter and at least one second semiconducting structure for the at least one second light emitter, the first semiconducting structure comprising a first semiconducting layer, the first semiconducting layer being adapted to emit a second radiation, the second semiconducting structure comprising a second semiconducting layer adapted to emit a fourth radiation, and depositing a mixture of first particles and second particles, each first particle being able to convert the second radiation into the first radiation, each second particle being able to convert the fourth radiation into the third radiation.

14. The method according to claim 13, further comprising at least one of the following:

the step for depositing comprises depositing a bulk of resin comprising the mixture onto each of the first and second semiconducting structures, and the step for depositing comprises depositing a grafting layer onto each surface of the first and second light emitters and depositing the mixture onto the grafting layer, each particle of the mixture being attached to a respective surface of each of the first and second light emitters by the grafting layer.

* * * * *